US012651887B2

(12) United States Patent
Von Malm

(10) Patent No.: US 12,651,887 B2
(45) Date of Patent: Jun. 9, 2026

(54) OPTOELECTRONIC SEMICONDUCTOR COMPONENT WITH INDIVIDUALLY CONTROLLABLE CONTACT ELEMENTS, AND METHOD FOR PRODUCING THE OPTOELECTRONIC SEMICONDUCTOR COMPONENT

(71) Applicant: OSRAM Opto Semiconductors GmbH, Regensburg (DE)

(72) Inventor: Norwin Von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 951 days.

(21) Appl. No.: 17/781,716

(22) PCT Filed: Nov. 24, 2020

(86) PCT No.: PCT/EP2020/083202
§ 371 (c)(1),
(2) Date: Jun. 2, 2022

(87) PCT Pub. No.: WO2021/110478
PCT Pub. Date: Jun. 10, 2021

(65) Prior Publication Data
US 2023/0006417 A1 Jan. 5, 2023

(30) Foreign Application Priority Data
Dec. 4, 2019 (DE) .................... 10 2019 218 864.8

(51) Int. Cl.
*G01S 7/481* (2006.01)
*H01S 5/026* (2006.01)
(Continued)

(52) U.S. Cl.
CPC .......... *H01S 5/0422* (2013.01); *G01S 7/4814* (2013.01); *H01S 5/026* (2013.01);
(Continued)

(58) Field of Classification Search
CPC ...... H01S 5/432; H01S 5/183; H01S 5/18305; H01S 5/18347; H01S 5/026;
(Continued)

(56) References Cited

U.S. PATENT DOCUMENTS

| | | |
|---|---|---|
| 6,618,410 B1 | 9/2003 | Fischer et al. |
| 2002/0126720 A1 | 9/2002 | Yang |

(Continued)

FOREIGN PATENT DOCUMENTS

| | | |
|---|---|---|
| CN | 1259237 A | 7/2000 |
| DE | 10 2012 106 364 A1 | 1/2014 |

(Continued)

OTHER PUBLICATIONS

International Search Report issued for the corresponding International Application No. PCT/EP2020/083202, dated Feb. 18, 2021, 5 pages (for informational purposes only).

(Continued)

*Primary Examiner* — Sanjiv D. Patel
(74) *Attorney, Agent, or Firm* — Viering, Jentschura & Partner mbB

(57) ABSTRACT

A laser light source may include an arrangement of surface-emitting semiconductor lasers to which a voltage is applied such that an operating current is below the threshold current and an intrinsic emission of the surface-emitting semiconductor laser is prevented. The laser light source also comprises a first semiconductor laser which emits radiation that enters the surface-emitting semiconductor laser such that induced emission takes place via the injection locking mechanism and the individual surface-emitting semiconductor lasers emit laser light having the same wavelength and polarisation direction as the irradiated radiation. The emission frequency of the first semiconductor laser can be changed by changing the operating current.

12 Claims, 8 Drawing Sheets

(51) Int. Cl.

| | | |
|---|---|---|
| *H01S 5/042* | (2006.01) | |
| *H01S 5/183* | (2006.01) | |
| *H01S 5/42* | (2006.01) | |
| *H01S 5/0234* | (2021.01) | |

(52) U.S. Cl.
CPC ...... *H01S 5/18305* (2013.01); *H01S 5/18369* (2013.01); *H01S 5/18388* (2013.01); *H01S 5/423* (2013.01); *H01S 5/0234* (2021.01)

(58) Field of Classification Search
CPC .............. H01S 5/18361; H01S 5/0234; H01S 5/18327; H10S 5/18341
See application file for complete search history.

(56) References Cited

U.S. PATENT DOCUMENTS

| | | | |
|---|---|---|---|
| 2010/0215070 | A1 | 8/2010 | Hattori |
| 2013/0266326 | A1* | 10/2013 | Joseph ............... H04B 10/1141 |
| | | | 398/130 |
| 2015/0129901 | A1 | 5/2015 | Hoeppel et al. |
| 2016/0365704 | A1 | 12/2016 | Johnson |
| 2019/0036308 | A1* | 1/2019 | Carson .................. H01S 5/0237 |
| 2019/0252312 | A1 | 8/2019 | Yu et al. |
| 2019/0268068 | A1 | 8/2019 | Dacha et al. |

| | | | | |
|---|---|---|---|---|
| 2019/0363520 | A1* | 11/2019 | Laflaquiere ......... H01S 5/18305 |
| 2020/0083669 | A1* | 3/2020 | Na ........................... G01P 13/00 |
| 2020/0388988 | A1* | 12/2020 | Enzmann .............. H01S 5/0233 |

FOREIGN PATENT DOCUMENTS

| | | | | | |
|---|---|---|---|---|---|
| EP | | 3447862 | A1 | 2/2019 | |
| JP | | 2009147287 | A | 7/2009 | |
| WO | WO-2018192882 | A1 * | 10/2018 | ............. H01S 5/223 |
| WO | | 2019023401 | A1 | 1/2019 | |
| WO | | 2019038365 | A1 | 2/2019 | |

OTHER PUBLICATIONS

German Search Report issued for the corresponding German Application No. 10 2019 218 864.8, dated Aug. 5, 2020, 6 pages (for informational purposes only).

Chinese Search Report of corresponding Chinese Patent Application No. 202080083939.2, dated Mar. 20, 2025, 2 pages (for informational purposes only).

German Office Action issued for the corresponding DE patent application No. DE 11 2020 005 894.8, dated Aug. 4, 2025, 3 pages (For informational purposes only).

Search Report for parallel Application DE 11 2020 005 894.8, dated Aug. 2, 2024, 3 pages (for reference purpose only).

* cited by examiner

OPTOELECTRONIC SEMICONDUCTOR COMPONENT WITH INDIVIDUALLY CONTROLLABLE CONTACT ELEMENTS, AND METHOD FOR PRODUCING THE OPTOELECTRONIC SEMICONDUCTOR COMPONENT

CROSS-REFERENCE TO RELATED APPLICATION

The present application is a national stage entry according to 35 U.S.C. §371 of PCT application No.: PCT/EP2020/083202 filed on Nov. 24, 2020; which claims priority to German patent application DE 10 2019 218 864.8, filed on Dec. 4, 2019; all of which are incorporated herein by reference in their entirety and for all purposes.

TECHNICAL FIELD

The present application is related to optoelectronic semiconductor components having individually controllable contact elements, and is further related to methods for producing the optoelectronic semiconductor components having individually controllable contact elements.

BACKGROUND

Surface-emitting lasers, i.e. laser devices in which the generated laser light is emitted perpendicularly to a surface of a semiconductor layer arrangement, can be used for example in 3D sensor systems, for example for face recognition or for distance measurement in autonomous driving.

Efforts are generally being made to improve such surface-emitting lasers.

SUMMARY

The present disclosure is based on the objective of providing an improved surface-emitting laser device.

In accordance with embodiments, an optoelectronic semiconductor component has a multiplicity of light-emitting devices. The light-emitting devices each comprise a first resonator mirror, a second resonator mirror, and also an active zone arranged between the first and second resonator mirrors and suitable for emitting electromagnetic radiation, and also a second contact element. The second contact elements and a first contact element, which is electrically connected to a first semiconductor layer of a first conductivity type of the light-emitting devices, are contactable from a first main surface of the light-emitting devices. At least two of the second contact elements are each individually controllable. That is to say that the second contact elements can each be individually controllable. In accordance with further embodiments, the contact elements can also be controllable in groups. In this case, the groups can each contain an identical or else a different number of light-emitting devices.

In accordance with embodiments, the optoelectronic semiconductor component furthermore has an arrangement of circuits, each suitable for controlling the second contact elements of the light-emitting devices.

By way of example, the arrangement of circuits is arranged in a circuit substrate. The circuit substrate can be arranged in a manner adjoining the first main surface.

By way of example, the first conductivity type can be the p conductivity type.

In accordance with embodiments, the optoelectronic semiconductor component furthermore has a multiplicity of optical elements arranged on a side of the light-emitting devices facing away from the first main surface. In this case, at least two of the optical elements are each formed differently, such that emitted radiation is emitted in different spatial directions in each case.

In accordance with embodiments, the optical elements are arranged at a distance from a second main surface of the light-emitting devices. This can be effected by means of suitable spacers. The interspace between the optical elements and the second main surface can contain for example air or a transparent material, for example a polymer or an oxide. In this way, the radiation emitted by the individual optoelectronic devices can be further shaped or deflected. In accordance with further embodiments, the optical elements can also directly adjoin the second main surface of the light-emitting devices.

In accordance with embodiments, optoelectronic devices, each adjoined by different optical elements, can each be individually controllable. In this way, for example, different spatial regions can be irradiated in a targeted manner. Furthermore, different emission patterns can be generated in each case over the course of time.

The optoelectronic semiconductor component can furthermore have a first contact layer connected to the first semiconductor layer. The first contact layer can be arranged between the active zone and the first resonator mirror.

Alternatively, the optoelectronic semiconductor component can comprise first connecting lines suitable for connecting the first semiconductor layer of adjacent light-emitting devices to one another.

In accordance with embodiments, an electronic device comprises the optoelectronic semiconductor component as described above and a detector. On account of the specific construction of the optoelectronic semiconductor component as described above, the detector can have a simpler construction. By way of example, the detector can have a single light-sensitive area.

A method for producing an optoelectronic semiconductor component with a multiplicity of light-emitting devices comprises forming a first resonator mirror, a second resonator mirror, an active zone between the first and second resonator mirrors, and also forming second contact elements. The active zone is suitable for emitting electromagnetic radiation. The second contact elements and a first contact element, which is electrically connected to a first semiconductor layer of a first conductivity type of the light-emitting devices, are contactable from a first main surface of the light-emitting devices. At least two of the second contact elements are individually controllable. That is to say that the second contact elements can be controllable in each case individually or in groups.

By way of example, it is possible to form firstly the first resonator mirror, then the active zone and finally the second resonator mirror. Alternatively, it is also possible to form firstly the second resonator mirror, then the active zone and finally the first resonator mirror.

The method can furthermore comprise applying a circuit substrate, in which is arranged an arrangement of circuits, each suitable for controlling the second contact elements of the light-emitting devices, over the first main surface of the light-emitting devices.

In accordance with embodiments, the first and second resonator mirrors and also the active zone are grown over a growth substrate, which is removed after the circuit substrate has been applied.

BRIEF DESCRIPTION OF THE DRAWINGS

The person skilled in the art will recognize additional features and advantages after reading the following detailed description and examining the accompanying drawings.

The accompanying drawings serve to afford an understanding of exemplary embodiments. The drawings illustrate exemplary embodiments and together with the description serve to elucidate same. Further exemplary embodiments and numerous advantages from among those intended are evident directly from the following detailed description. The elements and structures shown in the drawings are not necessarily illustrated in a manner true to scale with respect to one another. Identical reference signs refer to identical or mutually corresponding elements and structures.

DETAILED DESCRIPTION

Figures 1, 2A:
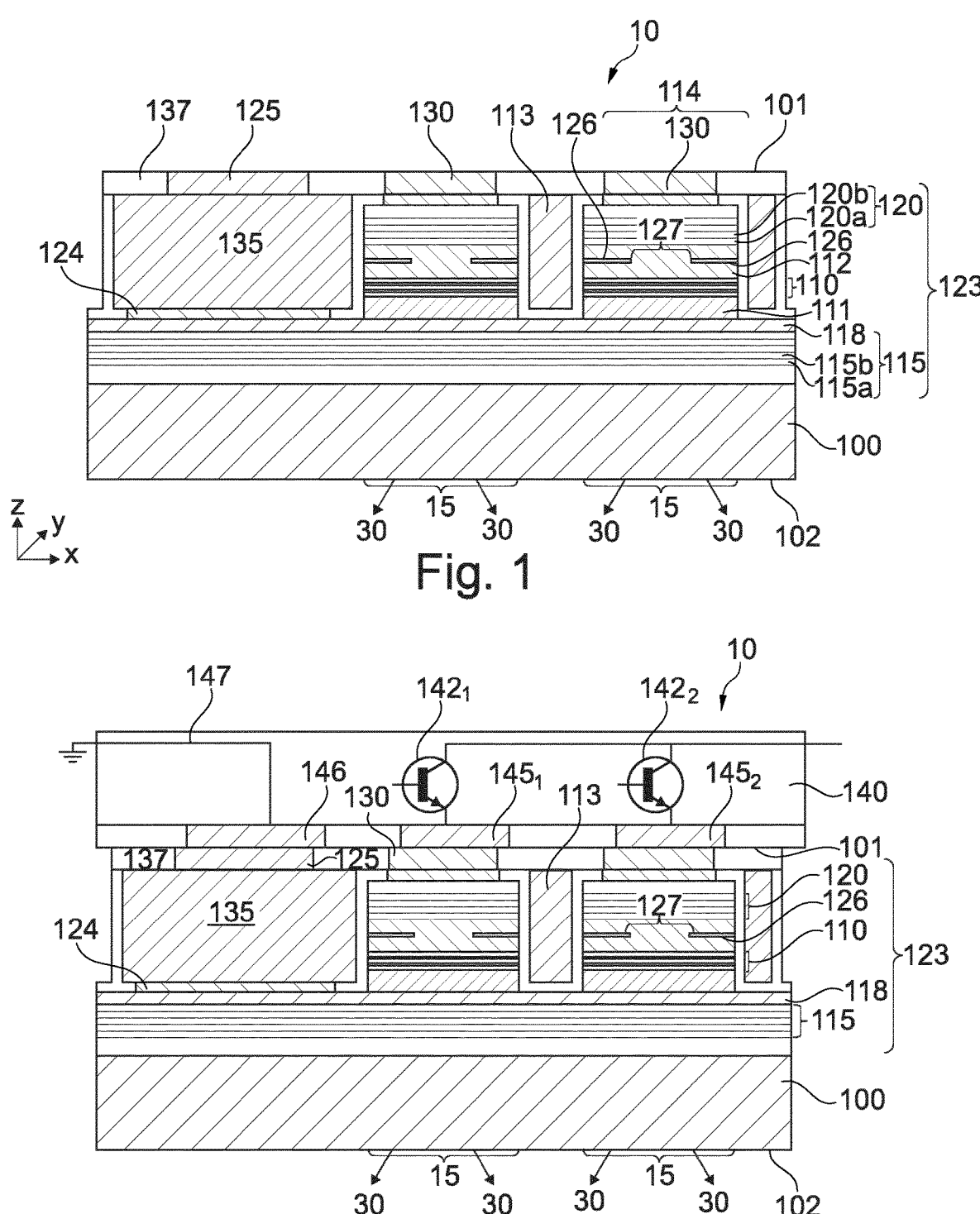
FIG. 1 shows a schematic cross-sectional view of an optoelectronic semiconductor component in accordance with embodiments.
FIGS. 2A to 2D show schematic cross-sectional views of further embodiments of optoelectronic semiconductor components.

In the following detailed description, reference is made to the accompanying drawings, which form part of the disclosure and show specific exemplary embodiments for illustration purposes.

In this context, a direction terminology such as "top side", "bottom", "front side", "rear side", "over", "on", "in front of", "behind", "at the front", "at the back", etc. relates to the orientation of the figures currently being described. Since the component parts of the exemplary embodiments can be positioned in different orientations, the direction terminology serves only for elucidation and is not restrictive in any way.

The description of the exemplary embodiments is not restrictive since other exemplary embodiments also exist and structural or logical changes can be made, without in that case departing from the scope defined by the patent claims. In particular, elements of exemplary embodiments described below can be combined with elements of other exemplary embodiments from among those described, provided that nothing to the contrary is evident from the context.

The terms "wafer" or "semiconductor substrate" used in the following description can encompass any semiconductor-based structure having a semiconductor surface. Wafer and structure should be understood as including doped and undoped semiconductors, epitaxial semiconductor layers, if appropriate carried by a base support, and further semiconductor structures. By way of example, a layer composed of a first semiconductor material can be grown on a growth substrate composed of a second semiconductor material, for example a GaAs substrate, a GaN substrate or an Si substrate, or composed of an insulating material, for example on a sapphire substrate.

Depending on the purpose of use, the semiconductor can be based on a direct or an indirect semiconductor material. Examples of semiconductor materials that are particularly suitable for generating electromagnetic radiation encompass, in particular, nitride semiconductor compounds, which can generate ultraviolet light, blue light or light of longer wavelength, for example, such as GaN, InGaN, AlN, AlGaN, AlGaInN, AlGaInBN, for example, phosphide semiconductor compounds, which can generate green light or light of longer wavelength, for example, such as GaAsP, AlGaInP, GaP, AlGaP, InGaAsP, for example, and further semiconductor materials such as GaAs, AlGaAs, InGaAs, AlInGaAs, SiC, ZnSe, ZnO, $Ga_2O_3$, diamond, hexagonal Bn and combinations of the materials mentioned. The stoichiometric ratio of the compound semiconductor materials can vary. Further examples of semiconductor materials can encompass silicon, silicon-germanium and germanium. In the context of the present description, the term "semiconductor" also includes organic semiconductor materials.

The term "substrate" generally encompasses insulating, conducting or semiconductor substrates.

The terms "lateral" and "horizontal", as used in this description, are intended to describe an orientation or alignment which extends substantially parallel to a first surface of a substrate or semiconductor body. This can be the surface of a wafer or of a chip (die), for example.

The horizontal direction can lie for example in a plane perpendicular to a growth direction during the growth of layers.

The term "vertical", as used in this description, is intended to describe an orientation which extends substantially perpendicular to the first surface of a substrate or semiconductor body. The vertical direction can correspond for example to a growth direction during the growth of layers.

Insofar as the terms "have", "contain", "encompass", "comprise" and the like are used here, they are open terms which indicate the presence of the stated elements or features, but do not exclude the presence of further elements or features. The indefinite articles and the definite articles encompass both the plural and the singular, provided that something to the contrary is not clearly evident from the context.

In the context of this description, the term "electrically connected" denotes a low-resistance electrical connection between the connected elements. The electrically connected elements need not necessarily be directly connected to one another. Further elements can be arranged between electrically connected elements.

The term "electrically connected" also encompasses tunnel contacts between the connected elements.

FIG. 1 shows a vertical cross-sectional view of an optoelectronic semiconductor component in accordance with embodiments. The optoelectronic semiconductor component 10 comprises a multiplicity of light-emitting devices 15. The light-emitting devices 15 each comprises a first resonator mirror 115, a second resonator mirror 120, and also an active zone 110 arranged between the first and second resonator mirrors 115, 120 and suitable for emitting electromagnetic radiation 30. Furthermore, the light-emitting devices each comprise a second contact element 130. The second contact elements 130 and a first contact element 125, which is connected to semiconductor layers of a first conductivity type of the light-emitting devices 15, are contactable from a first main surface 101 of the optoelectronic semiconductor component 10. At least two of the second contact elements 130 of the multiplicity of light-emitting devices 15 are each individually controllable. By way of example, in each case groups of light-emitting devices 15 can each be individually controllable. In accordance with further embodiments, it is also possible for all the light-emitting devices 15 each to be individually controllable.

The optoelectronic semiconductor component 10 illustrated in FIG. 1 constitutes a so-called VCSEL, i.e. vertical-cavity surface-emitting laser. A layer stack 123 comprising, inter alia, layers for forming the second resonator mirror 120 and the active zone 110 is structured by separating trenches 113 to form a multiplicity of mesas 114. In this case, the separating trenches 113 are arranged in such a way that for example they extend both in the x-direction and in the y-direction and define a multiplicity of mesas 114. The mesas 114 can have for example a rectangular, square, hexagonal or round shape in plan view. The individual mesas 114 and thus the light-emitting devices 15 can be arranged for example regularly, for example in rows and columns. In accordance with further embodiments, they can also be arranged as a chequered pattern. In accordance with further embodiments, they can also be arranged quasi-randomly. By way of example, an optoelectronic semiconductor component 10 can comprise more than 10 or more than 100 light-emitting devices 15. The number of light-emitting devices 15 can be less than 100 000 or less than 50 000, for example.

The separating trenches 113 are dimensioned for example in such a way that they separate active zones 110 of adjacent light-emitting devices 15. Furthermore, the layers for forming the second resonator mirror 120 are severed by the trenches 113. As is shown in FIG. 1, in accordance with embodiments, the separating trenches 113 do not sever the layers of the first resonator mirror 115.

The semiconductor layer stack 123 can comprise a first semiconductor layer 111 of the first conductivity type, for example n- or p-type, and also a second semiconductor layer 112 of the second conductivity type, for example p- or n-type. The first contact element 125 is connected to the first semiconductor layer 111 of the first conductivity type. The second contact element is connected to the second semiconductor layer 112 of the second conductivity type. The active zone 110 is arranged between the first semiconductor layer 111 and the second semiconductor layer 112. The active zone 110 can have for example a quantum well structure, for example a single quantum well (SQW) structure or a multi quantum well (MQW) structure for generating radiation. In this case, the designation "quantum well structure" does not exhibit any significance with regard to the dimensionality of the quantization. It therefore encompasses, inter alia, quantum wells, quantum wires and quantum dots and any combination of these layers.

The first resonator mirror 115 can have respectively alternately stacked first layers 115a of a first composition and second layers 115b of a second composition. The second resonator mirror 120 can likewise have alternately stacked layers 120a, 120b each having a different composition.

The respectively alternately stacked layers of the first or second resonator mirror 115, 120 each have different refractive indices. By way of example, the layers can alternately have a high refractive index (n>3.1) and a low refractive index (n<3.1) and be formed as a Bragg reflector.

By way of example, the layer thickness can be $\lambda/4$ or a multiple of $\lambda/4$, where $\lambda$ indicates the wavelength of the light to be reflected in the corresponding medium. The first or the second resonator mirror 115, 120 can have 2 to 50 individual layers, for example. A typical layer thickness of the individual layers can be approximately 30 to 150 nm, for example 50 nm. The layer stack can furthermore contain one or two or a plurality of layers which are thicker than approximately 180 nm, for example thicker than 200 nm. By way of example, the second resonator mirror 120 can have a total reflectivity of 99.8% or more for the laser radiation. The first resonator mirror 115 can be formed as an output coupling mirror for the radiation from the resonator and has for example a lower reflectivity than the second resonator mirror.

Electromagnetic radiation generated in the active zone 110 can be reflected between the first resonator mirror 115 and the second resonator mirror 120 in such a way as to form in the resonator a radiation field 21 for the generation of coherent radiation (laser radiation) by way of induced emission in the active zone. Overall, the distance between the first and second resonator mirrors 115, 120 corresponds to at least half the effective emitted wavelength ($\lambda/2n$, where n corresponds to the refractive index of the active zone), such that standing waves can form within the resonator. The laser radiation 30 generated can be coupled out of the resonator via the first resonator mirror 115, for example. The semiconductor laser device 10 thus forms a so-called VCSEL, i.e. vertical-cavity surface-emitting laser.

In accordance with embodiments, the alternately stacked layers for forming the first and/or second resonator mirror 115, 120 can comprise semiconductor layers, at least one layer of which is doped in each case. By way of example, at least one semiconductor layer of the stacked layers of the first resonator mirror 115 can be doped with a first conductivity type, for example p- or n-type. In a corresponding manner, at least one of the semiconductor layers of the second resonator mirror 120 can be doped with dopants of a second conductivity type, which is different than the first conductivity type, for example n- or p-type.

In accordance with further embodiments, at least the first or the second resonator mirror 115, 120 can be constructed exclusively from dielectric layers. In this case, the layer stack 123 additionally has a first semiconductor layer (not shown) of the first conductivity type and also a second semiconductor layer of a second conductivity type (not shown). By way of example, in this case, the alternately arranged dielectric layers can alternately have a high refractive index (n>1.7) and a low refractive index (n<1.7) and be embodied as a Bragg reflector.

By way of example, the semiconductor layers of the first and second resonator mirrors 115, 120 and also of the active zone 110 can be based on the InGaAlP material system and comprise semiconductor layers of the composition $In_x$-$Ga_yAl_{1-x-y}P$ where $0 \leq x$, $y \leq 1$ and $x+y \leq 1$.

In accordance with further embodiments, the semiconductor layers of the first and second resonator mirrors 115, 120 and also of the active zone 110 can be based on the AlGaAs layer system and contain in each case layers of the composition $Al_xGa_{1-x}As$, where $0 \leq x \leq 1$.

An emitted wavelength of the optoelectronic semiconductor component 10 can be less than 1000 nm, for example. The wavelength can be greater than 800 nm, for example.

The light-emitting devices 15 shown in FIG. 1 are not connected in parallel, for example, rather the second contact elements 130 are each insulated from one another, for example. As a consequence, the light-emitting devices 15 can each be controlled individually. In accordance with embodiments, the semiconductor layers of the second conductivity type of each of the light-emitting devices 15 can be connected to one another via a first contact layer 118. By way of example, the first contact layer 118, as shown in FIG. 1, can be arranged between the active zone 110 and the first resonator mirror 115. The first contact layer 118 can be for example a highly doped semiconductor layer of the first conductivity type. By way of example, the first contact layer 118 can have a very high transverse conductivity. A material of the first contact layer 118 can be GaAs or InGaAs, for example. In accordance with embodiments shown in FIG. 1, the first conductivity type can be the n conductivity type. The substrate 100 can be a growth substrate for growing the semiconductor layer stack 123. By way of example, the substrate 100 can be a GaAs substrate.

As is illustrated in FIG. 1, the layers of the first resonator mirror 115 can be arranged over the growth substrate 100. The layers of the first resonator mirror 115 can be doped with the first conductivity type, for example. The first contact layer 118 can be arranged over the first resonator mirror 115. Arranged over the first contact layer 118 are layers of the active zone 110, followed by the layers of the second resonator mirror 120. The layers of the second resonator mirror 120 can be doped with the second conductivity type, for example.

A buried insulating layer, for example an oxide layer 126, can be arranged in each case in the edge region of the mesas 114, such that an aperture 127 is formed in each case in the central region of the mesas 114. Said aperture 127 produces focusing of the charge carriers and optical confinement of the electromagnetic power generated.

The separating trenches 113 can extend as far as a top side of the first contact layer 118. The separating trenches can for example be filled with an insulating material or else be filled with a conducting material insulated from the adjacent mesas by an insulating material. As is shown in FIG. 1, a first connecting element 124 can be connected to the first contact layer 118. The first connecting element 124 can be connected to the first contact element 125 via a conductive filling 135, for example a metal filling. Both the first contact element 125 and the multiplicity of second contact elements 130 are arranged at a first main surface 101 of the optoelectronic semiconductor component. In this way, the individual light-emitting devices 15 can each be controlled from the first main surface 101 of the optoelectronic semiconductor component. In accordance with further embodiments, the contact trench 113 can also extend more deeply into the semiconductor layer stack 123. By way of example, the electrical connection of the semiconductor layer of the first conductivity type can also be made possible by way of an alternative structure.

Filling the separating trenches 113 makes it possible to produce a particularly stable optoelectronic semiconductor component, in particular a plane-parallel and compact optoelectronic semiconductor component. Filling the separating trenches 113 with an insulating material reduces the risk of a short circuit between the light-emitting devices 15.

FIG. 2A shows a schematic cross-sectional view of an optoelectronic semiconductor component in accordance with further embodiments. In addition to the component parts illustrated in FIG. 1, the optoelectronic semiconductor component 10 shown in FIG. 2A additionally comprises an arrangement of circuits $142_1$, $142_2$, ... $142_n$, each suitable for controlling the second contact elements 130 of the light-emitting devices 15. As is shown in FIG. 2A, each individual one of these circuits is assigned to exactly one light-emitting device and thus suitable for controlling the latter. By way of example, the arrangement of circuits can be arranged or formed in a circuit substrate. By way of example, the circuit substrate 140 can comprise a semiconductor substrate, for example composed of silicon, in which the individual switching elements are embodied. By way of example, the circuits $142_1$, $142_2$ can each be embodied as an integrated circuit, for example as a CMOS circuit ("complementary metal-oxide-semiconductor"). The control or driver circuits can fulfill further functions in addition to their function as current source for the individual light-emitting devices 15. By way of example, they can contain shift registers, memory cells or digital data interfaces. In accordance with configurations, algorithms for evaluating a detector signal (time-to-digital converter, histogram processing) can be integrated in each case.

In addition, the respective feed lines to the first contact element 125 can also be formed as a common connection line 147 in the circuit substrate 140. The common connection line 147 can be connected to a first connection region 146, for example, which is connected to the first contact element 125. The circuit arrangement or the circuit substrate 140 with the circuits $142_1$, $142_2$, ... $142_n$ arranged therein can be arranged in a manner adjoining the first main surface 1 of the light-emitting devices.

In this way, the optoelectronic semiconductor component can be realized particularly compactly. As a consequence, an extremely compact VCSEL emitter can be provided. In addition, the individual light-emitting devices can each be controlled via short connecting lines, such that no additional inductances are produced or inductances are reduced. In particular, possible inductances do not result in a frequency limitation. As a consequence, extremely short pulses can be generated. As is shown in FIG. 2A, the generated electromagnetic radiation can be emitted via the growth substrate 100 and the second main surface 102 of the optoelectronic semiconductor component.

By virtue of the fact that both the first contact element and the second contact elements are contactable from the first main surface of the light-emitting devices, it is possible to produce the optoelectronic semiconductor component in a simple manner. By way of example, after joining together the optoelectronic devices with the circuit substrate, it is possible to dispense with further semiconductor processing methods. As a result, for example, method-dictated damage to the circuit arrangement is avoided.

By virtue of the fact that the second contact elements are each individually controllable, further functionalities can be integrated into the optoelectronic semiconductor component in a simple manner. Furthermore, an emitted power can be set in a simple manner by targeted operation of a selected number of light-emitting devices.

The first contact element 125 is connected to a semiconductor layer 111 of the first conductivity type, and the second contact elements 130 are each connected to a semiconductor layer 112 of the second conductivity type. In accordance with embodiments, the first conductivity type can be the n conductivity type, and the second conductivity type is the p conductivity type. In these embodiments, the production method can be simplified. In accordance with further embodiments, the first conductivity type can be the p conductivity type, and the second conductivity type is the n conductivity type. In these embodiments, the CMOS circuits $142_1$, $142_2$, ... $142_n$ can control the optoelectronic devices via n-doped semiconductor regions, which can be more efficient to realize.

Figure 2B:
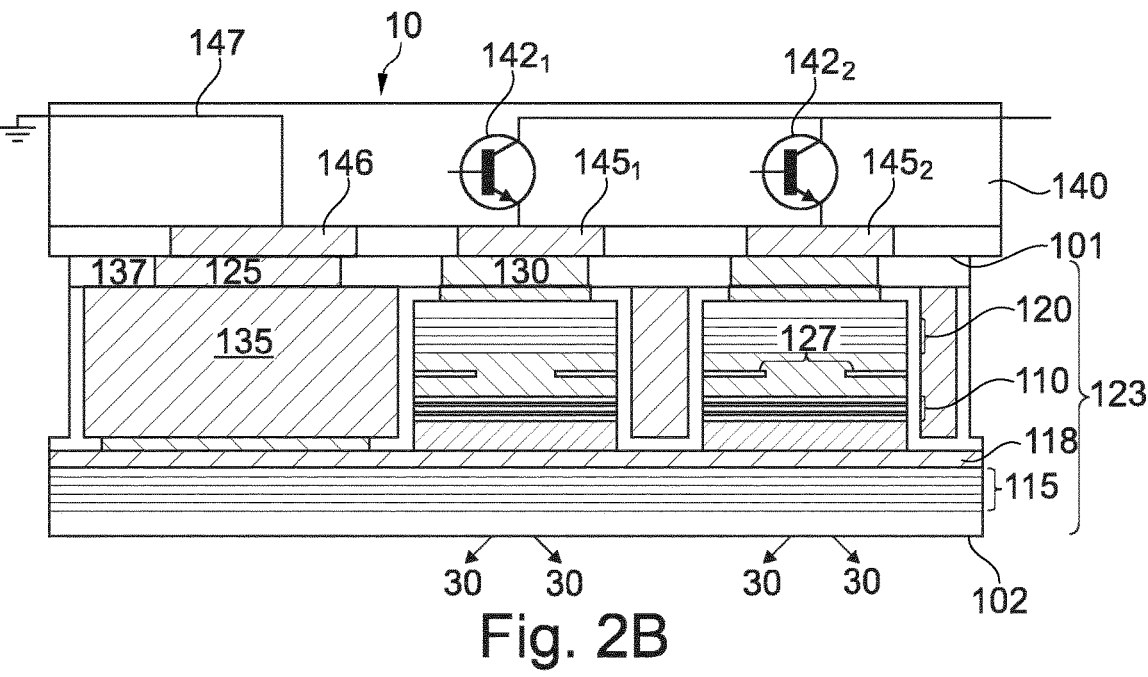

In accordance with embodiments illustrated in FIG. 2B, the growth substrate 100 can also be removed. By virtue of the fact that the layer stack 123 is connected to the circuit substrate 140, a stability of the arrangement can be achieved. A thin-film flip-chip VCSEL component can be realized in this way. The further component parts of the optoelectronic semiconductor components in FIG. 2B are similar to the component parts of the optoelectronic semiconductor component in FIG. 2A. The removal of the growth substrate from the thermal path results in better heat dissipation for the arrangement of the light-emitting devices 15. By way of example, silicon has a significantly higher thermal conductivity than GaAs, which can be used as material for the growth substrate. As a consequence, the optoelectronic semiconductor component 10 can be operated at higher power densities, which results in an increased range. Furthermore, the optoelectronic semiconductor component 10 can be operated in a wider temperature range. Furthermore, with removal of the growth substrate (for example GaAs), it is also possible to realize the emission of electromagnetic radiation with a wavelength that is less than a wavelength corresponding to the band gap of the material of the growth substrate (860 nm in the case of GaAs).

Figure 2C:
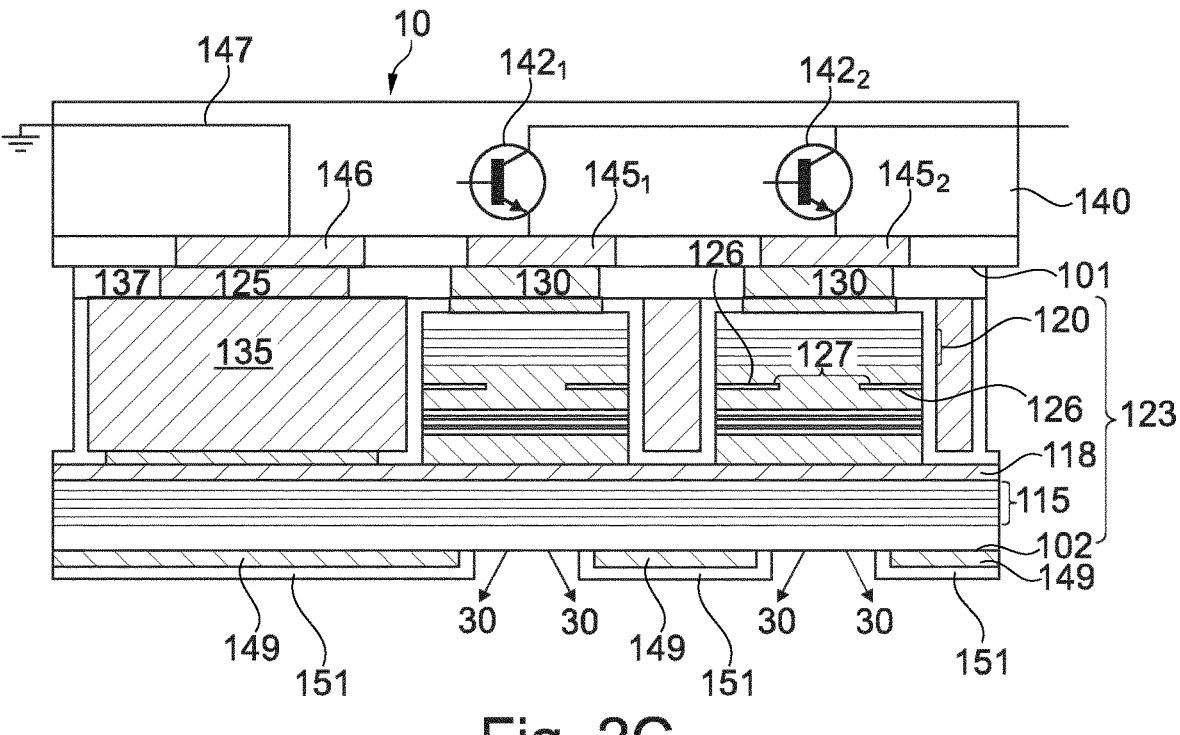

In accordance with embodiments illustrated in FIG. 2C, an electrical connection of the semiconductor layers of the first conductivity type of the light-emitting device can be realized in each case via a first connecting line 149 arranged on a side of the semiconductor layer stack 123 facing away from the first main surface 101. By way of example, in this case, the first contact layer 118 can be made very thin or alternatively removed in regions of the optoelectronic semiconductor component. An insulating material 151 can be arranged in each case over the first connecting lines 149 in order to insulate the latter from the outer region. By way of example, the first connecting lines 149 are arranged in such a way that they are each present in a region in which little light emission is to be expected. By way of example, the first connecting lines 149 can overlap with the separating trenches 113 and the buried insulating layer 126.

Figure 2D:
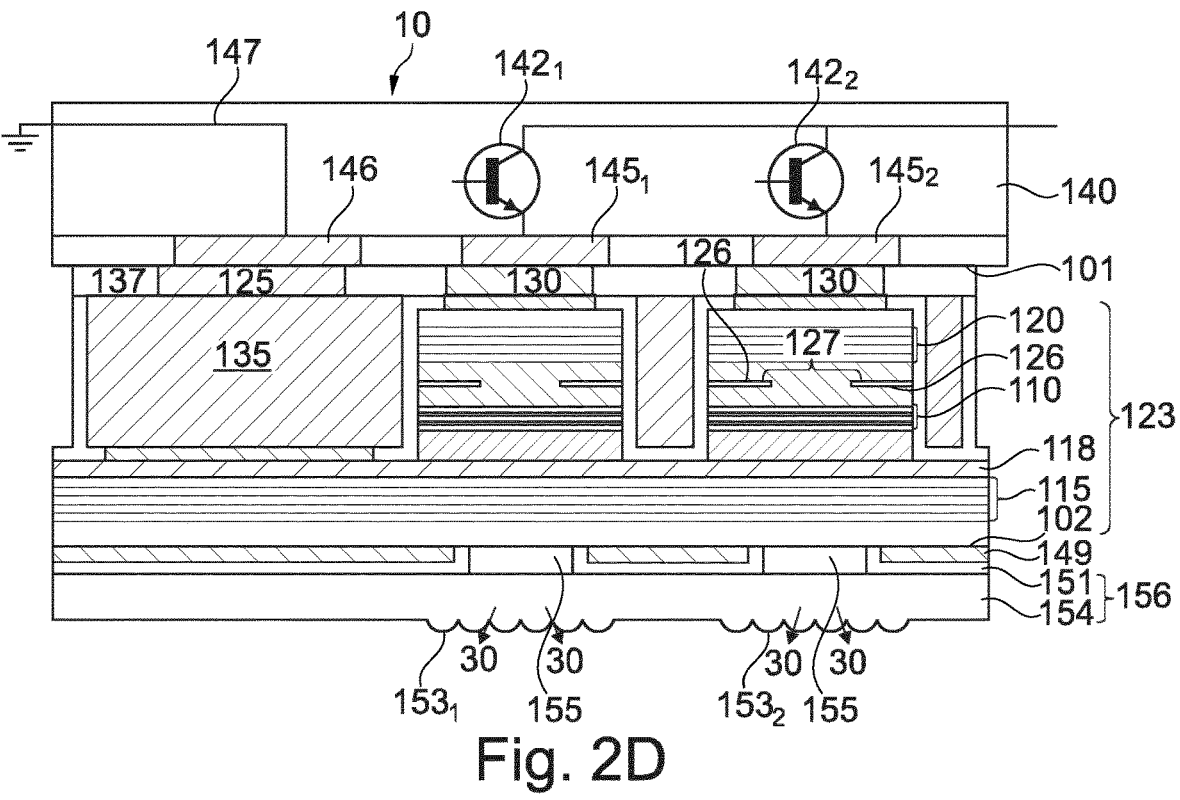
Figure 3A:
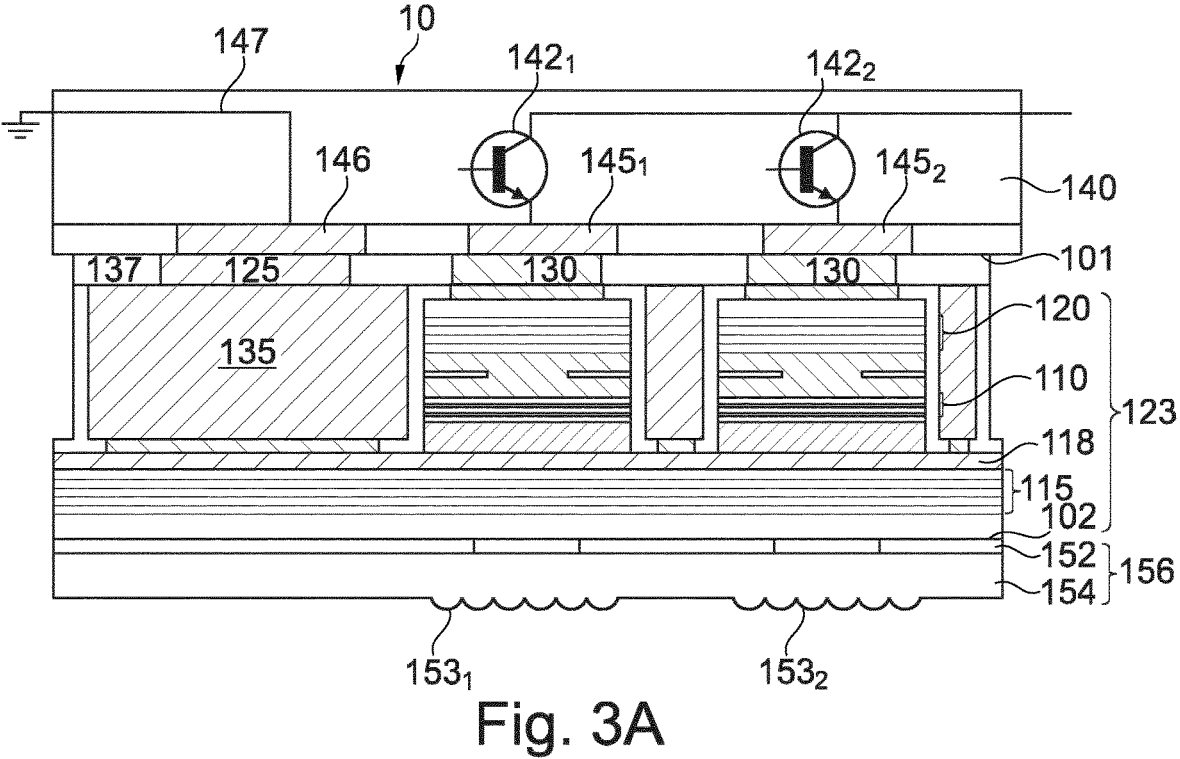
FIGS. 3A and 3B show vertical cross-sectional views of an optoelectronic semiconductor component in accordance with further embodiments.
Figure 3B:
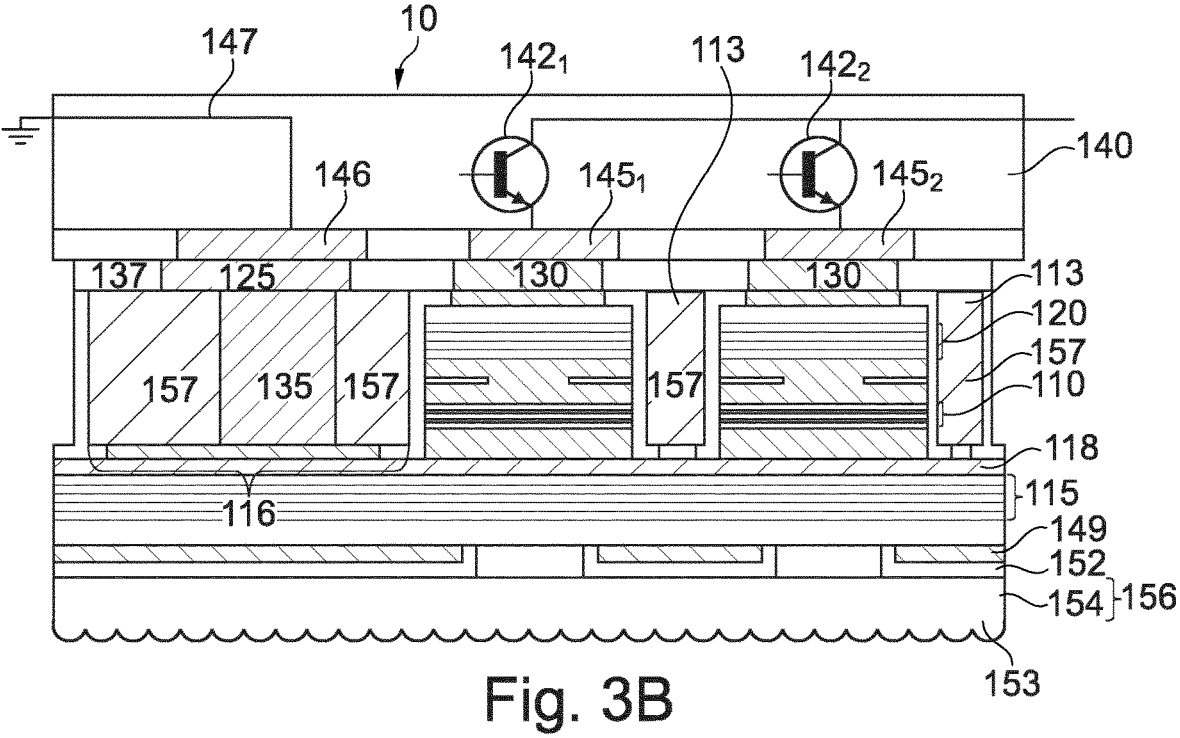

In accordance with embodiments illustrated in FIG. 2D, 3A and 3B, the optoelectronic semiconductor component can additionally have a layer 156 for beam shaping. The layer 156 for beam shaping can have for example a multiplicity of optical elements $153_1$, $153_2$, . . . $153_n$. The optical elements can be arranged on the side of the second main surface 102 of the optoelectronic semiconductor component. In accordance with embodiments, the optical elements $153_1$, $153_2$, . . . $153_n$ can each be formed differently and thus enable the emitted electromagnetic radiation to be emitted at different solid angles in each case. By way of example, the optical elements $153_1$, $153_2$, . . . $153_n$ can each be integrated into a transparent carrier 154 and form a multilens array. In this way, the layer 156 for beam shaping can be connected to the semiconductor layer stack 123 in a simple manner. The transparent carrier 154 having the optical elements $153_1$, $153_2$, . . . $153n$ can be applied for example in such a way that an air gap 155 is present between the layer stack 153 and the transparent carrier 154. The emission characteristic of the optoelectronic semiconductor component can be adjusted further in this way. In accordance with further embodiments, the air gap 155 can also be filled with an insulating transparent material, for example polymer or oxide. The arrangement shown in FIG. 2D thus makes it possible for optoelectronic devices that each have a different emission characteristic to be controlled by the associated circuit $142_1$, $142_2$, . . . $142_n$ in a targeted manner. By way of example, optoelectronic devices or groups thereof having a different emission characteristic in each case can be energized sequentially. As a consequence, the spatial resolution of a detector that detects the radiation of the optoelectronic semiconductor component is increased. Furthermore, the detector can be significantly simplified, such that the costs of the overall system are reduced and the necessary structural space is reduced. The detector can even have just a single light-sensitive area and nevertheless record a spatial image as a result of the sequential energization of the optoelectronic devices.

Generally, the layer 156 for beam shaping as described in the context of the present description can contain a refractive optical unit, for example a multilens array, or a diffractive optical unit, for example a metal lens. The layer 156 for beam shaping can be applied in an aligned manner as a separately fabricated wafer, for example composed of glass, quartz, silicon or other suitable materials. In accordance with further embodiments, the layer 156 for beam shaping can be produced from a liquid resin (spin-on glass, silicone, epoxy, acrylate, polyurethane, polycarbonate, poly-benzo-cyclobutene) by molding or multi-photon absorption.

FIG. 3A shows a schematic cross-sectional view of an optoelectronic semiconductor component in accordance with further embodiments. In a departure from embodiments illustrated in FIG. 2D, here the conductive filling 135 in the separating trenches 113 is in each case connected to one another via first connecting elements 124. The electrical connection among the parts of the semiconductor layer of the first conductivity type of the individual light-emitting devices can be improved in this way. In this case, the first connecting elements 124 form a grid extending in front of and behind the illustrated plane of the drawing in the x-direction.

In accordance with the embodiments illustrated in FIG. 3A, the layer 156 for beam shaping, i.e. for example the transparent carrier 154 with the multiplicity of optical elements $153_1$, $153_2$, . . . $153_n$, can directly adjoin the semiconductor layer stack 123 or can be spaced apart from the latter by means of a spacer 152. The spacer 152 can be produced from an electrically conductive or insulating material and can be arranged in each case in such a way that the regions in which electromagnetic radiation is emitted are exposed and not covered by the spacer 152. This gives rise to an interface between the adjoining medium and the air gap, which can further influence the optical properties of each of the light-emitting devices. Here, too, the individual optical elements $153_1$, $153_2$, . . . $153_n$ can each be formed differently.

In accordance with embodiments illustrated in FIG. 3B, in the connection trench 116, via which the first connecting element 124 is connected to the first contact element 125, part of the conductive filling 135 can be replaced by insulation material 157. By way of example, a mechanical stress within the optoelectronic semiconductor component can be reduced as a result. Particularly if the individual optoelectronic semiconductor components are produced at the wafer level, such a mechanical stress can result in considerable warpage of the wafer that hampers processing of the optoelectronic semiconductor components. For this reason, it can be advantageous to fill the edge region of the connection trench 116 with a potting material or spin-on glass. The electrical contact is furthermore realized by a conductive filling 135 with a smaller horizontal dimension. As is shown in FIG. 3B, here the separating trenches 113 are each filled with insulation material 157. The fact that the insulation trenches 113 are each filled with the insulation material 157 additionally affords the advantage that short circuits between the individual mesas 114 can be avoided.

A method for producing an optoelectronic semiconductor component in accordance with embodiments is described in greater detail below.

Figure 4A:
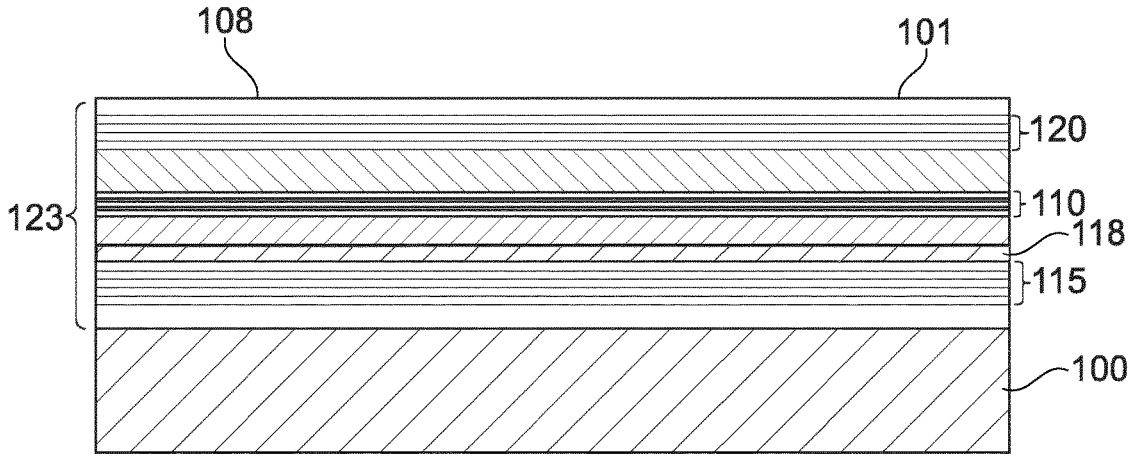
FIGS. 4A to 4G show a cross-sectional view of a workpiece during implementation of a method for producing an optoelectronic semiconductor component.

FIG. 4A shows a schematic cross-sectional view of a workpiece 108 during implementation of the method. A semiconductor layer stack 123 is applied to a growth substrate 100, for example a GaAs substrate. In the context of the present description, the layer stack applied over the growth substrate 100 is generally referred to as "semiconductor layer stack" 123. Materials which are different than semiconductor materials can also be arranged in said semiconductor layer stack 123. By way of example, the layers for constructing the first resonator mirror 115 and also the first contact layer 118 can be arranged in the semiconductor layer stack 123. Furthermore, the layers for forming the active zone 110 and the layers for forming the second resonator mirror 120 are arranged in the semiconductor layer stack 123. In accordance with embodiments, the first contact layer 118 can be very thin or absent. The first main surface 101 of the semiconductor layer stack 123 constitutes the first main surface of the optoelectronic semiconductor component and is exposed. By way of example, the region of the first resonator mirror 115 can contain a first semiconductor layer of a first conductivity type, for example n-type. The layers of the second resonator mirror 120 can contain one or more second semiconductor layers of the second conductivity type, for example p-type.

Figure 4B:
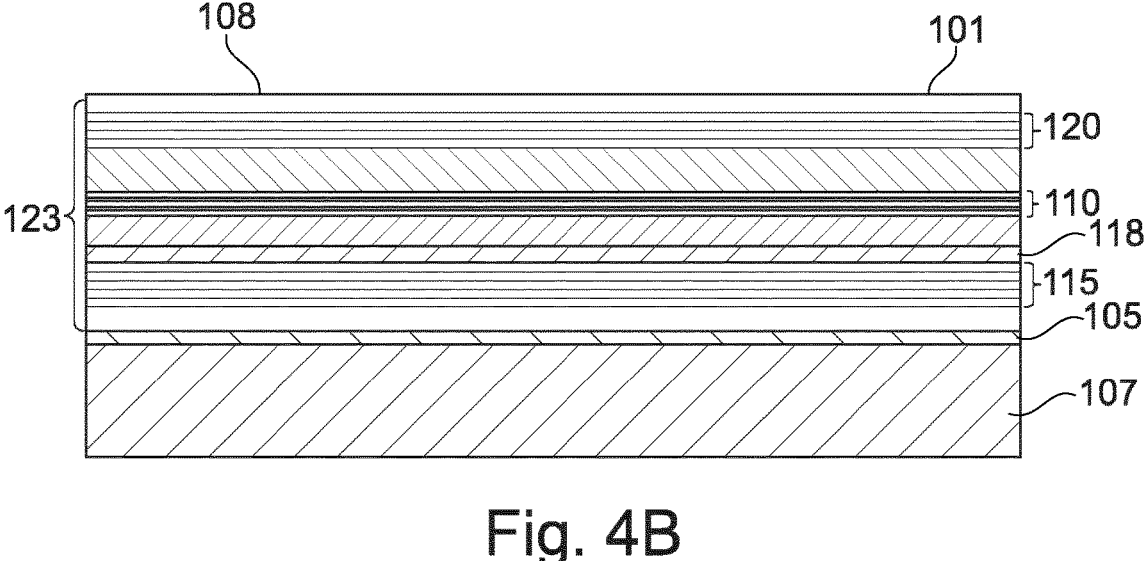

In accordance with an alternative configuration (FIG. 4B), the layers of the first conductivity type can also be p-conducting and the layers of the second conductivity type are n-conducting. In this case, for example, the layers of the semiconductor layer stack 123 can firstly be grown on a growth substrate, such that the n-conducting layers are grown first, followed by the p-conducting layers. The semiconductor layer stack 123 produced can then be applied to a handling carrier 107, for example a silicon carrier, and can be connected to the latter via a connecting material 105. As a consequence, the p-conducting layers are arranged between the active zone 110 and the handling carrier 107. In the case of this configuration, for example, circuits that are to be applied later can control the individual optoelectronic devices via n-type contacts, which may be more efficient to realize.

Figure 4C:
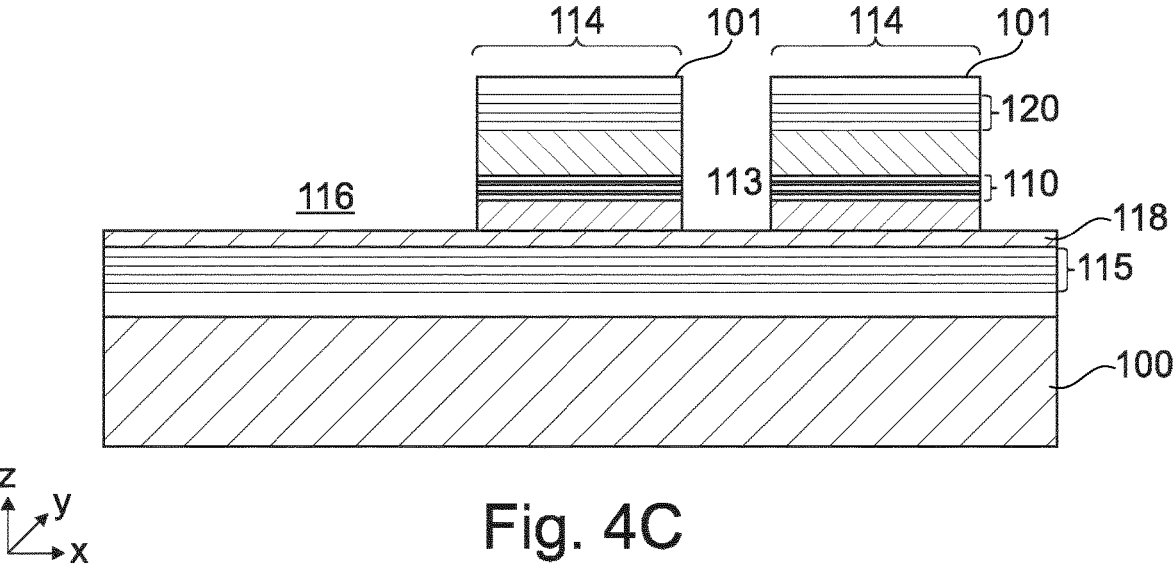

Proceeding from the structure illustrated in FIG. 4A, subsequently, as illustrated in FIG. 4C, separating trenches 113 are formed in the semiconductor layer stack 123. A multiplicity of mesas 114 are structured as a result. In this case, the separating trenches 113 extend for example both in the x-direction and in the y-direction. In addition to the structuring of the separating trenches 113, a connection trench 116 is defined, which exposes for example the first contact layer 118 in a region, for example an edge region of the electronic semiconductor component. Via the connection trench 116, the first semiconductor layer of the first conductivity type can be contacted, for example via the first contact layer 118. By way of example, the semiconductor layer stack 123 can additionally contain an etch stop layer (not illustrated). The latter can be arranged over the first contact layer 118, for example.

Figure 4D:
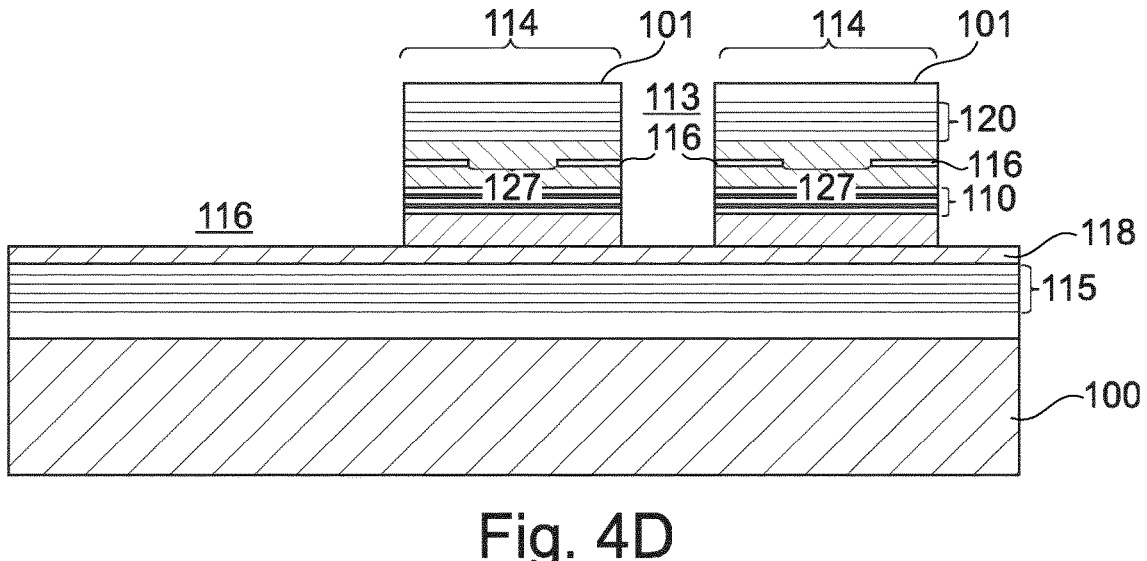
Figure 4E:
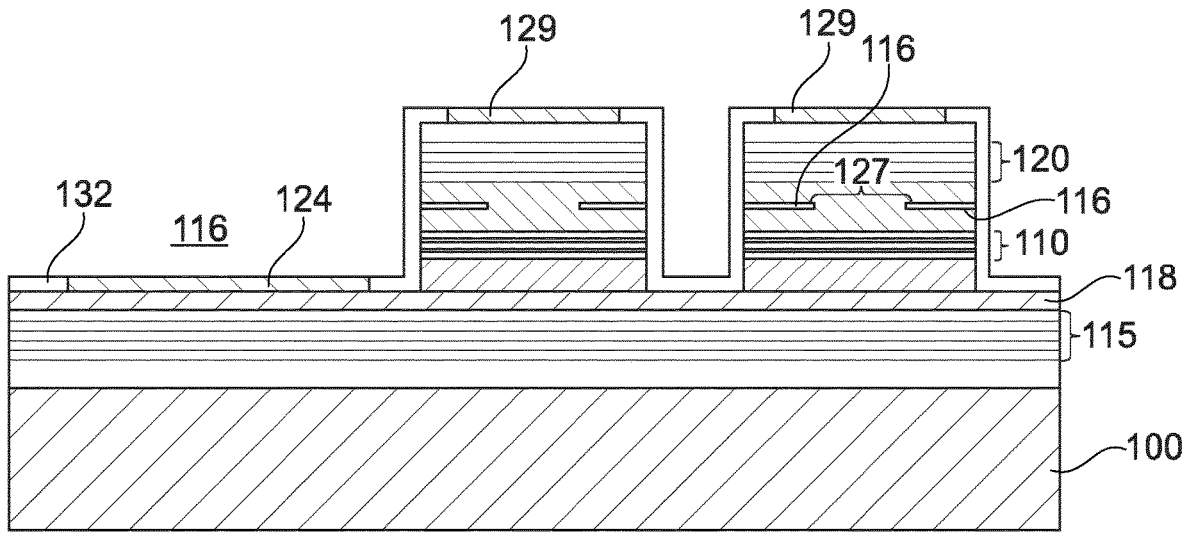
Figure 4F:
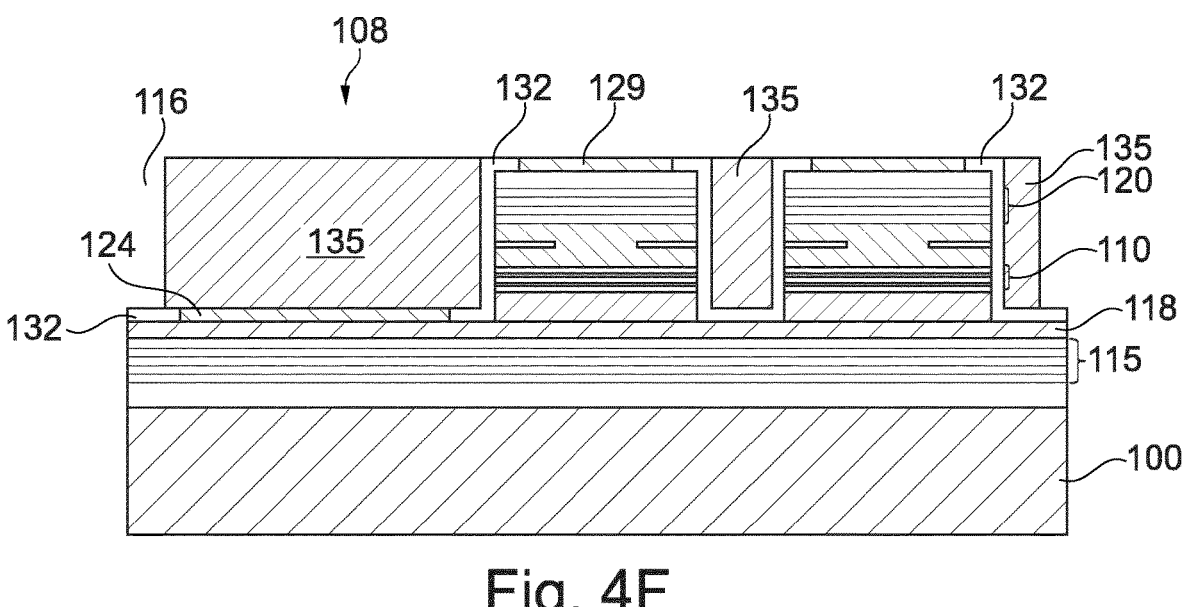

In a succeeding step, as is illustrated in FIG. 4D, for example, a buried insulating layer 126 is formed in the edge region of the mesas 114. As a result, the aperture 127 is defined in the central region of the individual mesas. By way of example, the buried insulating layer can be an oxide layer. In accordance with further embodiments, however, an insulating layer, for example an $SiO_2$ layer, can also be formed on the first main surface 101 of each of the individual mesas, as a result of which an aperture is likewise formed.

Afterward, in accordance with embodiments, a passivation layer 132, for example composed of $Al_2O_3$, $Si_3N_4$, $SiO_2$ or a combination of these materials, can be formed. Furthermore, second connecting elements 129 are formed on the first main surface 101 of the layer stack 123. Furthermore, a first connecting element 124 is formed in the region of the connection trench 116 over the first contact layer 118. By way of example, the first and/or the second connecting element 124, 129 can be produced from ZnO, gold or AuGe.

Afterward, in accordance with embodiments, both the insulation trenches 113 and the connection trench 116 are filled with a conductive filling 135. By way of example, this can be effected by means of an electrolytic method. Examples of the material of the conductive filling 135 comprise for example copper, gold, silver, nickel or tungsten. Filling with the conductive filling 135 results in a height equalization outside the light-emitting devices 15. Alternatively, as is shown in FIG. 3B, the height equalization can also be effected by means of an insulator such as, for example, $SiO_2$, spin-on glass (SOG), potting compound or mold compound or other suitable insulating materials. By way of example, the insulating material can be applied after the deposition of the conductive filling 135 in the connection trench 116. The deposition of the insulating material can be followed by a planarization step, e.g. by means of chemical mechanical polishing (CMP).

Figure 4G:
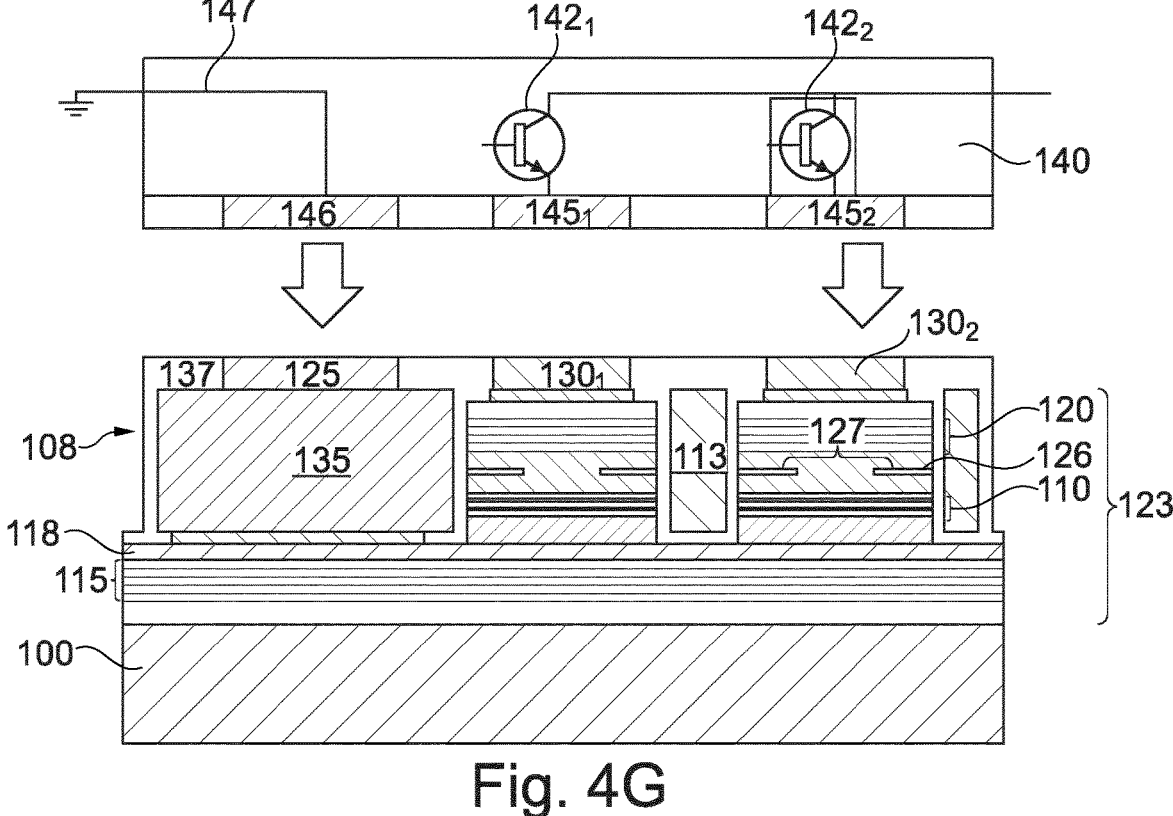

Afterward, as illustrated in FIG. 4G, a passivation layer 137 is applied. Furthermore, openings are formed in the passivation layer 137. The openings are subsequently filled with conductive material. This results in the formation of the first contact element 125 in the region of the connection trench 116. Furthermore, the second contact elements 130 are formed in each case over the mesas 114. By way of example, the electrically conductive material for forming the first and second contact elements 125, 130 can comprise gold, copper or nickel.

Furthermore, a CMP (chemical mechanical polishing method) can be carried out. A very planar surface of the workpiece 108 is achieved in this way. Accordingly, it is possible, in a subsequent step, to connect the workpiece 108 to a circuit substrate 140 having a multiplicity of circuits $142_1$, $142_2$, . . . $142_n$ embodied therein.

As is shown in FIG. 4G, a first connection region 145 is arranged on a side of the circuit substrate 140 facing the workpiece 108.

Furthermore, a multiplicity of second connection regions $146_1$, $146_2$, . . . $146_n$ are arranged on this side. The first and second connection regions can be produced from gold, copper or nickel, for example. In this case, the circuits $142_1$, $142_2$, . . . $142_n$ can each be connected one-to-one to the second contact elements $130_1$, $130_2$, . . . $130_n$ in such a way that one circuit controls exactly one light-emitting device. In accordance with further embodiments, one of the circuits $142_1$ can also be connected to an associated second contact element in such a way that a group of light-emitting devices is controlled by the circuit $142_1$.

The workpiece 108 can be connected to a control circuit 142 or an arrangement of control circuits $142_1$, $142_2$, . . . $142_n$, in principle, by means of a chip-to-wafer, wafer-to-wafer or thin-film transfer method such as p-transfer printing, for example.

By way of example, the arrangement of control circuits $142_1$, $142_2$, . . . $142_n$ can be connected to the workpiece at the wafer level. The connection can be effected for example by means of a hybrid direct bonding method, thermocompression bonding or structured solder metals.

By way of example, the growth substrate 100 can be removed by grinding/polishing, by wet or dry etching or by a combination of these methods.

By way of example, the optoelectronic semiconductor component shown in FIGS. 2A, 2B, 3A, 3B, 2C, 2D can be obtained as a consequence.

Figure 5:
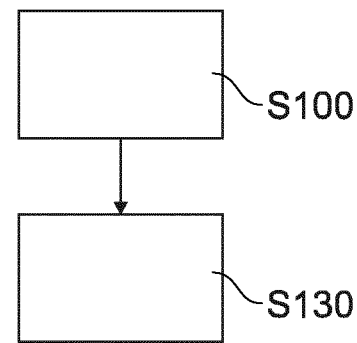
FIG. 5 summarizes a method in accordance with embodiments.

FIG. 5 summarizes a method in accordance with embodiments. A method for producing an optoelectronic semiconductor component with a multiplicity of light-emitting devices comprises forming (S100) a first resonator mirror, a second resonator mirror, and also an active zone between the first and second resonator mirrors. The active zone is suitable for emitting electromagnetic radiation. The method furthermore comprises forming (S130) a second contact element. The second contact elements and a first contact element, which is electrically connected to a first semiconductor layer of a first conductivity type of the light-emitting devices, are contactable from a first main surface of the light-emitting devices, and the second contact elements are each individually controllable. Here it is possible to form firstly the first resonator mirror, then the active zone and finally the second resonator mirror. In accordance with further configurations, it is possible to form firstly the second resonator mirror, then the active zone and finally the first resonator mirror.

Figure 6:
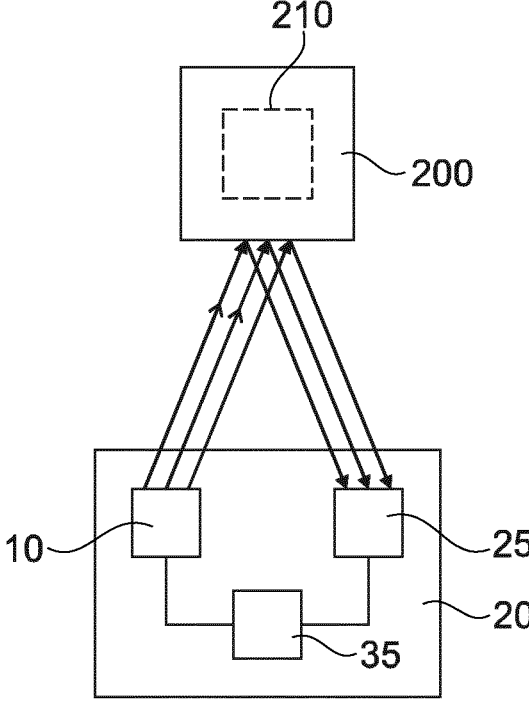
FIG. 6 shows a schematic view of an electronic device in accordance with embodiments.

FIG. 6 shows an electronic device 20 in accordance with embodiments. The electronic device 20 comprises the optoelectronic semiconductor component 10 as described above. By way of example, the electronic device can be a sensor, for example a sensor for face recognition or for distance measurement in autonomous driving. In accordance with embodiments, the electronic device 20 can also comprise a suitable detector unit 25. By way of example, electromagnetic laser radiation emitted by the optoelectronic semiconductor component 10 can be reflected by the object 200. The reflected radiation can be detected by the detector 35. The object 200 can be for example a face or a vehicle or else a lens of a cellular phone or other electronic device. In accordance with further embodiments, the object 200 can also be some other object.

The electronic device 20 can furthermore comprise a circuit 35 for processing the measurement results obtained. By way of example, the circuit 35 can be suitable for controlling the individual circuits 142$_2$, 142$_2$, . . . 142$_n$ of the optoelectronic semiconductor component or for receiving control signals from said circuits. Furthermore, the circuit 35 can obtain signals from the sensor unit 25 and acquire information from these signals, or process these signals further. By way of example, the electronic device 20 can be a ToF sensor ("time of flight") or some other sensor for generating 3D information about an object. By virtue of the fact that, as has been described above, individual lasers or groups of lasers can be controlled such that they irradiate different spatial directions in a targeted manner, the spatial resolution of the detector can be increased and/or the detector can be significantly simplified. In particular, in accordance with embodiments, the detector can even have just a single light-sensitive area and nevertheless record a spatial image as a result of the sequential energization of the optoelectronic devices.

As a consequence, the costs of the system can be significantly reduced and the structural space can also be decreased further. On account of the compact design, the electronic device 20 can be used expediently in mobile terminals such as, for example, cellular phones, PDAs ("personal digital assistant") and others.

Furthermore, the electronic device 20 can easily be integrated into the outer skin of a vehicle.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein.

Therefore, the invention is restricted only by the claims and the equivalents thereof.

A variety of devices and arrangements and also a production method are listed as paragraphs below. The following paragraphs present various aspects and implementations of the proposed principles and concepts, which can be combined in various ways. Such combinations are not restricted to those indicated below:

1. An optoelectronic semiconductor component (10) with a multiplicity of light-emitting devices (15), each comprising
   a first resonator mirror (115),
   a second resonator mirror (120), and also
   an active zone (110) arranged between the first and second resonator mirrors (115, 120) and suitable for emitting electromagnetic radiation (30), and also
   a second contact element (130), wherein the second contact elements (130) and a first contact element (125), which is electrically connected to a first semiconductor layer (111) of a first conductivity type of the light-emitting devices (15), are contactable from a first main surface (101) of the light-emitting devices, and
   at least two of the second contact elements (130) are each individually controllable.

2. The optoelectronic semiconductor component (10) according to paragraph 1, furthermore comprising an arrangement of circuits (142$_1$, 142$_2$, . . . 142$_n$), each suitable for controlling the second contact elements (130) of the light-emitting devices (15).

3. Optoelectronic semiconductor component (10) according to paragraph 2, wherein the arrangement of circuits (142$_1$, 142$_2$, . . . 142$_n$) is arranged in a circuit substrate (140).

4. The optoelectronic semiconductor component (10) according to paragraph 3, wherein the circuit substrate (140) is arranged in a manner adjoining the first main surface (101).

5. The optoelectronic semiconductor component (10) according to any of the preceding paragraphs, wherein the first conductivity type is the p conductivity type.

6. The optoelectronic semiconductor component (10) according to any of the preceding paragraphs, furthermore comprising a multiplicity of optical elements (153$_1$, 153$_2$, . . . 153$_n$) arranged on a side of the light-emitting devices (15) facing away from the first main surface (101), wherein at least two of the optical elements (153$_1$, 153$_2$, . . . 153$_n$) are each formed differently, such that emitted radiation is emitted in different spatial directions in each case.

7. The optoelectronic semiconductor component (10) according to paragraph 6, wherein the optical elements (153$_1$, 153$_2$, . . . 153$_n$) are arranged at a distance from the second main surface (102) of the light-emitting devices (15).

8. The optoelectronic semiconductor component (10) according to paragraph 6 or 7, wherein optoelectronic devices (15), each adjoined by different optical elements (153$_1$, 153$_2$, . . . 153$_n$), are each individually controllable.

9. The optoelectronic semiconductor component (10) according to any of the preceding paragraphs, furthermore comprising a first contact layer (118) connected to the first semiconductor layer (111), wherein the first contact layer (118) is arranged between the active zone (110) and the first resonator mirror (115).

10. The optoelectronic semiconductor component (10) according to any of the preceding paragraphs, furthermore comprising first connecting lines (149) suitable for connecting the first semiconductor layer (111) of adjacent light-emitting devices (15) to one another.

11. An electronic device (20) comprising the optoelectronic semiconductor component (10) according to any of the preceding paragraphs and a detector (200).

12. The electronic device according to paragraph 11, wherein the detector (200) has a single light-sensitive area (210).

13. A method for producing an optoelectronic semiconductor component (10) with a multiplicity of light-emitting devices, comprising:

forming (S100) a first resonator mirror (115), a second resonator mirror (120), and also an active zone (110) between the first and second resonator mirrors (115, 120), wherein the active zone (110) is suitable for emitting electromagnetic radiation (30), and also forming (S130) a multiplicity of second contact elements (130), wherein the second contact elements (130) and a first contact element (125), which is electrically connected to a first semiconductor layer (111) of a first conductivity type of the light-emitting devices, are contactable from a first main surface (101) of the light-emitting devices (15), and the second contact elements (130) are each individually controllable.

14. The method according to paragraph 13, furthermore comprising applying a circuit substrate (140), in which is arranged an arrangement of circuits ($142_1$, $142_2$, . . . $142_n$), each suitable for controlling the second contact elements (130) of the light-emitting devices, over the first main surface (101) of the light-emitting devices.

15. The method according to paragraph 14, wherein the first and second resonator mirrors (115, 120) and also the active zone (110) are grown over a growth substrate (100), which is removed after the circuit substrate (140) has been applied.

LIST OF REFERENCE SIGNS

10 Optoelectronic semiconductor component
15 Light-emitting device
20 Electronic device
25 Sensor unit
30 Emitted radiation
35 Processing unit
100 Growth substrate
101 First main surface
102 Second main surface
105 Connecting material
107 Handling carrier
108 Workpiece
110 Active zone
111 First semiconductor layer
112 Second semiconductor layer
113 Separating trench
114 Mesa
115 First resonator mirror
116 Connection trench
118 First contact layer
120 Second resonator mirror
123 Layer stack 124 First connecting element
125 First contact element
126 Buried insulating layer
127 Aperture
129 Second connecting element
130, $130_1$, $130_2$, . . . $130_n$ Second contact element
132 Passivation layer
135 Conductive filling
137 Insulating layer
140 Circuit substrate
$142_1$, $142_2$, . . . $142_n$ Circuit
$145_1$, $145_2$, . . . $145_n$ Second connection region
146 First connection region
147 Common connection line
149 First connecting line
151 Insulating material
152 Spacer
$153_1$, $153_2$, . . . $153_n$ Optical element
154 Transparent carrier
155 Air gap
156 Layer for beam shaping
157 Insulation material
200 Detector
210 Light-sensitive area

The invention claimed is:

1. An optoelectronic semiconductor component comprising:

two or more light-emitting devices, wherein each light-emitting device comprises:

a common first resonator mirror shared amongst the two or more light-emitting devices;

a second resonator mirror;

an active zone arranged between the first resonator mirror and the second resonator mirror, wherein the active zone is configured to emit electromagnetic radiation;

a first semiconductor layer of a first conductivity type;

a first contact element connected to the first semiconductor layer;

a second semiconductor layer of a second conductivity type;

a second contact element connected to the second semiconductor layer;

wherein the second contact element and the first contact element are contactable from a first main surface of the two or more light-emitting devices;

wherein the first semiconductor layers are arranged on a side of the active zone facing away from the first main surface and are electrically connected to one another on the side of the active zone facing away from the first main surface;

wherein the two or more light-emitting devices are configured to couple out generated laser radiation via a second main surface arranged on the side of the active zone facing away from the first main surface; and wherein at least two of the second contact elements are each individually controllable;

a first contact layer arranged between the active zone and the common first resonator mirror of the two or more light-emitting devices; wherein the first contact layer electrically connects the first semiconductor layers of the two or more light-emitting devices to one another;

one or more separating trenches arranged between the two or more light-emitting devices; wherein the common first resonator mirror is not severed by the one or more separating trenches, wherein the one or more separating trenches are filled with an insulating material; and an arrangement of circuits, each suitable for controlling the second contact element of the two or more light-emitting devices, wherein the arrangement of circuits is arranged in a circuit substrate, and wherein the circuit substrate adjoins the first main surface.

2. The optoelectronic semiconductor component as claimed in claim 1, wherein the first conductivity type is a n conductivity type.

3. The optoelectronic semiconductor component as claimed in claim 1, further comprising a multiplicity of optical elements arranged on a side of the two or more light-emitting devices facing away from the first main surface, wherein at least two of the optical elements are each formed differently, such that radiation is configured to be emitted in different spatial directions in each case.

4. The optoelectronic semiconductor component as claimed in claim 3, wherein the optical elements are arranged at a distance from the second main surface of the two or more light-emitting devices.

5. The optoelectronic semiconductor component as claimed in claim 3, wherein the optoelectronic devices, each adjoined by different optical elements, are each individually controllable.

6. The optoelectronic semiconductor component as claimed in claim 3, wherein the optical elements have a common transparent carrier and form a multilens array.

7. The optoelectronic semiconductor component as claimed in claim 1, further comprising first connecting lines, which electrically connect the first semiconductor layers of adjacent light-emitting devices to one another.

8. The optoelectronic semiconductor component as claimed in claim 7, wherein the connecting lines are arranged on the second main surface.

9. An electronic device comprising:

the optoelectronic semiconductor component as claimed in claim 1; and a detector.

10. The electronic device as claimed in claim 9, wherein the detector comprises a single light-sensitive area.

11. A method for producing an optoelectronic semiconductor component as claimed in claim 1, wherein the method comprises:

forming the first common resonator mirror, the second resonator mirror, the active zone between the first resonator mirror and the second resonator mirror, the first semiconductor layers and the second semiconductor layers of the two or more light-emitting devices, and the separating trenches, such that the two or more light-emitting devices are configured to couple out generated laser radiation via a second main surface arranged on the side of the active zone facing away from the first main surface; wherein the separating trenches are filled with an insulating material, electrically connecting the first semiconductor layers on a side of the active zones facing away from the first semiconductor surface; and forming the second contact elements and the first contact element, such that at least two of the second contact elements are each individually controllable, wherein the first contact element is electrically connected to the first semiconductor layers of the two or more light-emitting devices and such that the first contact element and the second contact elements are contactable from the first main surface of the two or more light-emitting devices; and applying a circuit substrate comprising an arrangement of circuits, each suitable for controlling the second contact elements of the two or more light-emitting devices, over the first main surface of the two or more light-emitting devices.

12. The method as claimed in claim 11, further comprising:

growing the first resonator mirror, the second resonator mirror, and the active zone over a growth substrate, and removing the growth substrate after applying the circuit substrate.

* * * * *